(12) United States Patent
Yasuda

(10) Patent No.: US 6,476,419 B1
(45) Date of Patent: Nov. 5, 2002

(54) ELECTROLUMINESCENCE DISPLAY DEVICE

(75) Inventor: Hitoshi Yasuda, Gifu (JP)

(73) Assignee: Sanyo Electric Co. Ltd. (JP)

( * ) Notice: Subject to any disclaimer, the term of this patent is extended or adjusted under 35 U.S.C. 154(b) by 0 days.

(21) Appl. No.: 09/501,411

(22) Filed: Feb. 9, 2000

(30) Foreign Application Priority Data

Feb. 9, 1999 (JP) .......................................... 11-031388

(51) Int. Cl.$^7$ .............................................. H01L 29/04
(52) U.S. Cl. ........................... 257/72; 257/59; 257/71; 345/76; 345/92
(58) Field of Search ...................... 257/72, 59, 71; 315/169.3; 345/76, 92

(56) References Cited

U.S. PATENT DOCUMENTS

| | | | |
|---|---|---|---|
| 5,714,790 A | * 2/1998 | Sakamoto | 257/440 |
| 5,895,936 A | * 4/1999 | Lee | 257/59 |
| 6,046,547 A | * 4/2000 | Nishio et al. | 315/169.3 |
| 6,104,041 A | * 8/2000 | Hsueh et al. | 257/59 |
| 6,137,551 A | * 10/2000 | Jeong | 349/38 |
| 6,246,179 B1 | * 6/2001 | Yamada | 315/169.3 |
| 6,252,248 B1 | * 6/2001 | Sano et al. | 257/59 |

FOREIGN PATENT DOCUMENTS

JP         62204568        * 9/1987    ................. 257/59

* cited by examiner

*Primary Examiner*—Eddie Lee
*Assistant Examiner*—Eugene Lee
(74) *Attorney, Agent, or Firm*—Cantor Colburn LLP

(57) ABSTRACT

An organic EL display device comprises a first TFT (30) for switching; a second TFT (40) for driving an organic EL element; and an organic EL element (60) having an anode (61), a cathode (67), an emissive element layer (66) interposed between both electrodes. Additionally, a first storage capacitor electrode (54) comprising Cr and a second storage capacitor electrode (55) also functioning as a p-Si film which is a source (31s) of the first TFT (30) constitute a first storage capacitor (70) via a gate insulating film (12), while said second storage capacitor electrode (55) and a third storage capacitor electrode (56) formed by extending a part of a power supply line (53) for causing the organic EL element (60) to emit light are arranged to be opposed to each other via an interlayer insulating film 15 to form a second storage capacitor (80). Thus, it is possible to implement a light emissive display device which achieves bright display while sufficiently holding charges within one pixel without reducing the aperture ratio.

14 Claims, 6 Drawing Sheets

ELECTROLUMINESCENCE DISPLAY DEVICE

BACKGROUND OF THE INVENTION

1. Field of the Invention

The present invention relates to a display device comprising an emissive element such as an electroluminescence element and thin film transistors.

2. Description of Related Art

Electroluminescence (EL) display devices using an electroluminescence element have recently attracted interest as potential replacements for devices such as CRT or LCD displays. For example, an EL display device having a thin film transistor (TFT) as a switching element for driving the EL element has been studied and developed.

FIG. 1 shows, in a plan view, one display pixel of a related organic EL display device. FIG. 2 is an equivalent circuit diagram of an organic EL display device corresponding to one display pixel. FIGS. 3A and 3B are cross sections taken along lines A—A and B—B in FIG. 1, respectively.

Referring to FIGS. 1 and 2, a display pixel is formed in a region enclosed by a gate signal line 151 and a drain signal line 152. Around the intersection of both signal lines is formed a first TFT 130 as a switching TFT. A source 131s of the first TFT 130 also functions as a storage capacitor electrode 155 constituting a capacitor between the source 131s and a storage capacitor electrode 154 which will be described later, and is connected to a gate 142 of a second TFT 140 which drives an organic EL element. A source 141s of the second TFT 140 is connected to an anode 161 of the organic EL element-while a drain 141d is connected to a power supply line 153 for driving the organic EL element.

The storage capacitor electrode 154 is disposed in parallel to the gate signal line 151 in the vicinity of the first TFT. The storage capacitor electrode 154 comprises chromium or the like and forms a capacitor 170 for accumulating charges between the storage capacitor electrode 154 and the storage capacitor electrode 155 connected to the source 131s of the first TFT 130 via a gate insulating film 112. The storage capacitor 170 is provided so as to hold a voltage to be applied to the gate 142 of the second TFT 140.

The first TFT 130, which is a switching TFT, will now be described.

Referring to FIG. 3A, on an insulating substrate 110 comprising a quartz glass, non-alkali glass, or the like, are provided the gate signal line 151 including gate electrodes 132 and comprising a refractory metal with a high melting point such as chromium (Cr), molybdenum (Mo), or the like, and the storage capacitor electrode 154.

Subsequently, the gate insulating film 112, and an active layer 131 comprising a poly-silicon (hereinafter referred to as "p-Si") film are sequentially formed, such that the active layer 131 has a so-called LDD (Lightly Doped Drain) structure. More specifically, low concentration regions 131LD are formed at both sides of the pair of channel regions 131c opposing to gate electrodes 132, and a source 131s and a drain 131d of high concentration regions are further formed to the outsides of the low concentration regions.

Further, over the entire surface covering the gate insulating film 112, the active layer 131, and stopper insulating films 114, an interlayer insulating film 115 having a multi-layer structure is provided, and a metal such as Al or the like is used to fill a contact hole formed in the position in the interlayer insulating film 115 corresponding to the drain 131d to form a drain electrode 116. Then, a planarization insulating layer 117 comprising an organic resin is provided on the entire surface to planarize the surface.

Next, the second TFT 140, which is an organic EL element driving TFT, will be described.

Referring to FIG. 3B, on the insulating substrate 110 comprising a quartz glass, non-alkali glass, or the like, the gate electrodes 142 each comprising a refractory metal (metal having a high melting point) such as Cr, Mo, or the like are formed, and the gate insulating film 112 and an active layer 141 comprising a p-Si film are sequentially formed thereon. In the active layer 141, channels 141c which are intrinsic or substantially intrinsic are formed at the positions above the respective gate electrodes 142, and the source 141s and the drain 141d are formed by doping p-type impurities at each side of the channel pair to thereby constitute a p-type channel TFT.

The interlayer insulating film 115 of a multi-layer structure is then provided over the entire surface on the gate insulating film 112 and the active layer 141. A contact hole provided in the interlayer insulating film 115 so as to correspond to the drain 141d is filled with a metal such as Al to form the power supply line 153 connected to the power supply 150. Further, the planarization insulating film 117 comprising an organic resin to planarize the surface is provided over the entire surface. On the planarization insulating film 117, a transparent electrode, in this case the anode 161 of the organic EL element, which comprises ITO is provided to make contact with the source 141s via a contact hole formed at the position of the planarization insulating film 117 and the interlayer insulating film 115 corresponding to the source 141s.

The organic EL element 160 comprises the anode 161 comprising ITO (Indium Tin Oxide) or the like and connected to the source 141s of the second TFT 140, an emissive element layer 166 comprising an organic compound, and a cathode 167 using magnesium-indium alloy, formed in that order. In the organic EL element 160, holes injected from the anode 161 and electrons injected from the cathode 167 are recombined inside the emissive element layer 166 to excite organic molecules forming the emissive element layer 166 for causing exciton. In the process of radiation and deactivation by the exciton, the emissive element layer 166 produces light which is emitted from the transparent anode 161 through the transparent insulating substrate 110.

As shown in FIG. 3B, the anode 161 forms an individual pattern corresponding to each display pixel, and the emissive element layer 166 which is somewhat larger than the anode 161 is formed so as to entirely cover the anode 161. On the other hand, the cathode 167, which can be commonly used electrically, is formed as a common electrode.

In each pixel, charges applied from the source 131s of the selected first TFT 130 are accumulated and held in the storage capacitor 170 and are also applied to the gates 142 of the second TFT 140. A current in accordance with a voltage applied to the gates 142 is applied from the power supply 150 to the organic EL element which then emits light.

In the EL display device, however, if the aperture ratio of the display pixel is small, light is irradiated from a small area of the emissive layer of the organic EL element, which results in an extremely dark display.

To cope with the foregoing disadvantage, increase of the aperture ratio may be considered. However, to increase the aperture ratio, the area of a storage capacitor which constitutes the non-emissive region within a display pixel must be decreased, which leads to problems. Especially, decrease in the storage capacitor area will reduce the storage capacity, which in turn makes it impossible for only the storage capacitor 170 to sufficiently hold the drain signal supplied from the first TFT 130 until next time the first TFT 130 is selected. As a result, the gates 142 of the second TFT 140 cannot be put into a sufficient on-state to cause the organic EL element to emit light for a sufficient period to provide a bright display.

SUMMARY OF THE INVENTION

The present invention was conceived in view of the above described problems of the related art and aims to provide an EL display device which can hold sufficient charge to produce a bright display without decreasing the aperture ratio.

In accordance with one aspect of the present invention, there is provided an electroluminescence display device comprising an electroluminescence element disposed on a substrate and having first and second electrodes and an emissive layer disposed between the first and second electrodes; a first thin film transistor in which a gate electrode is connected to a gate line and a first electrode area is connected to a data line; a second thin film transistor in which a gate electrode is connected to a second electrode area of said first thin film transistor, a first electrode area is connected to a power supply to said electroluminescence element, and a second electrode area is connected to the electroluminescence element; and first and second storage capacitors, one storage capacitor electrode of each of which is connected to the second electrode area of said first thin film transistor and to the gate electrode of said second thin film transistor.

In another aspect of the present invention, there is provided an electroluminescence display device comprising an electrolumincescence element having an anode, a cathode, and an emissive layer interposed between the anode and the cathode; a first thin film transistor in which a gate electrode is connected to a gate line and a first electrode area is connected to a data line; a second thin film transistor in which a gate electrode is connected to a second electrode area of said first thin film transistor, a first electrode area is connected to a power supply for said electroluminescence element, and a second electrode area is connected to the electroluminescence element; a first storage capacitor including a first storage capacitor electrode and a second storage capacitor electrode which is connected to the second electrode area of said first thin film transistor and to the gate electrode of said second thin film transistor; and a second storage capacitor including said second storage capacitor electrode and a third storage capacitor electrode connected to a power supply line for supplying a power from said power supply to said electroluminescence element.

In accordance with still another aspect of the present invention, there is provided an light emissive display device comprising an emissive element disposed on a substrate and having first and second electrodes and an emissive layer provided between the first and second electrodes; a first thin film transistor in which a gate electrode is connected to a gate line and a first electrode area is connected to a data line; a second thin film transistor in which a gate electrode is connected to a second electrode area of said first thin film transistor, a first electrode area is connected to a power supply for said emissive element, and a second electrode area is connected to the emissive element; and first and second storage capacitors each having one storage capacitor electrode connected to the second electrode area of said first thin film transistor and to the gate electrode of said second thin film transistor.

In accordance with another aspect of the present invention, said first storage capacitor is formed by arranging the first storage capacitor electrode and the second storage capacitor electrode connected to the second electrode area of the first thin film transistor and to the gate electrode of the second thin film transistor such that they are opposed to each other via an insulating layer, and said second storage capacitor is formed by arranging said second storage capacitor electrode and the third storage capacitor electrode such that they are opposed to each other via an insulating layer.

In accordance with another aspect of the present invention, said first and second storage capacitor share one electrode connected to both the second electrode area of said first thin film transistor and to the gate electrode of the second thin film transistor.

In accordance with another aspect of the present invention, said first storage capacitor is formed by arranging the first storage capacitor electrode and the second storage capacitor electrode connected to the second electrode area of the first thin film transistor and to the gate electrode of the second thin film transistor such that they are opposed to each other via an insulating layer, and said second storage capacitor is disposed so as to superpose said first storage capacitor and is formed by arranging said second storage capacitor electrode and the third storage capacitor electrode such that they are opposed to each other via an insulating layer.

The first and second storage capacitors as described above can easily increase the capacity of each pixel without reducing the aperture ratio and can securely hold a voltage applied to the gate electrode of the second thin film transistor for a sufficient period. As a result, a desired power (e.g. current) can be securely supplied from the power supply to the emissive element, such as an organic EL element, via the second thin film to thereby implement a display device providing bright display with high image quality.

In accordance with another aspect of the present invention, the other storage capacitor electrode of said second storage capacitor or the third storage capacitor electrode is integrally formed with the power supply line for supplying a power from said power supply to the first electrode area of the second thin film transistor from said power supply.

In accordance with still another aspect of the present invention, a predetermined direct current voltage is applied to the first storage capacitor electrode.

By thus forming the other storage capacitor electrode of the second storage capacitor to be integrally formed with the power supply line, it is possible to accurately dispose said other storage capacitor electrode at a predetermined position, for example, a position superimposing the first storage capacitor, only with a change in the pattern of the power supply line. This eliminates any need for extra processes for forming the second storage capacitor, and improved display quality can be obtained without raising the manufacturing cost.

In accordance with still another aspect of the present invention, the emissive layer may use an organic compound. An emissive layer using an organic compound is very advantageous in a color display device because of the possible variations of emissive colors and a wide selection of possible materials.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
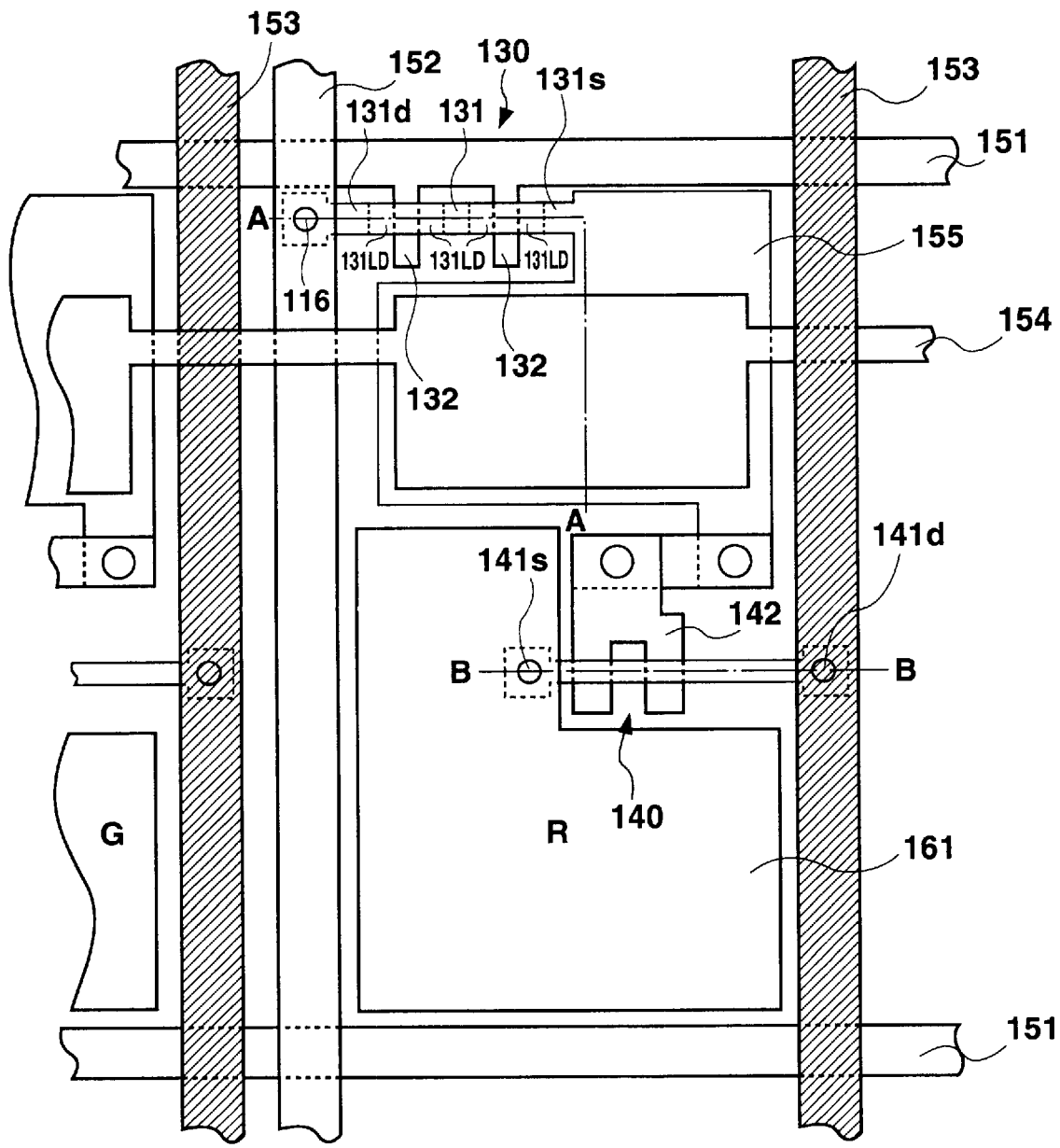
FIG. 1 is a plan view of a related EL display device.
Figure 2:
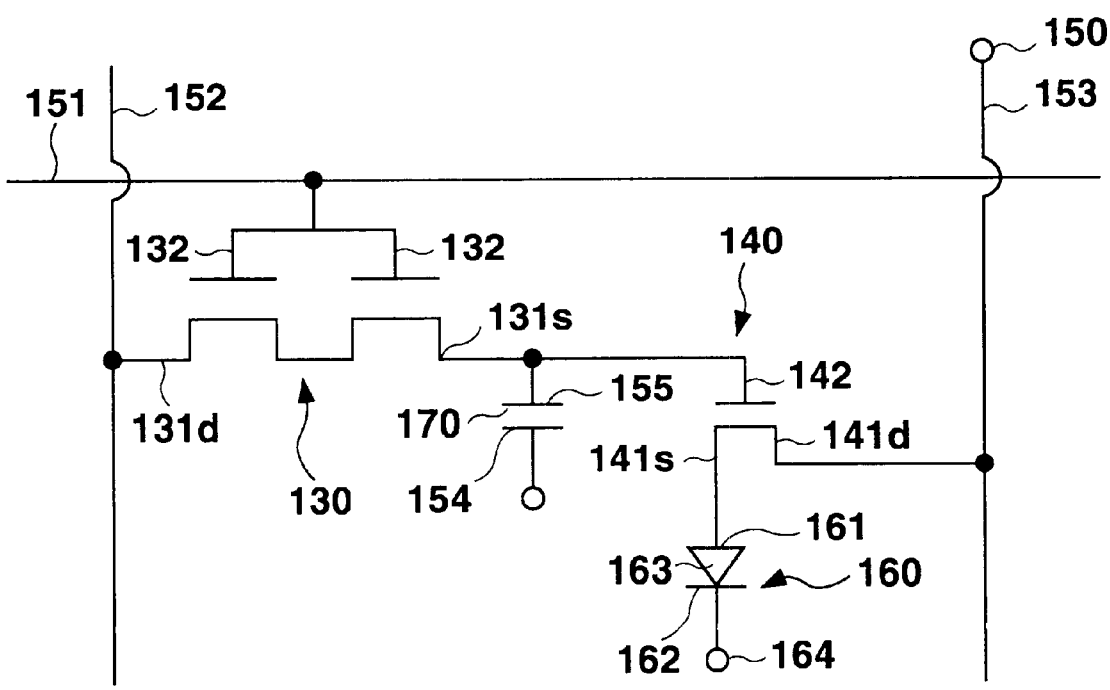
FIG. 2 is an equivalent circuit diagram of a related EL display device.
Figure 3A:
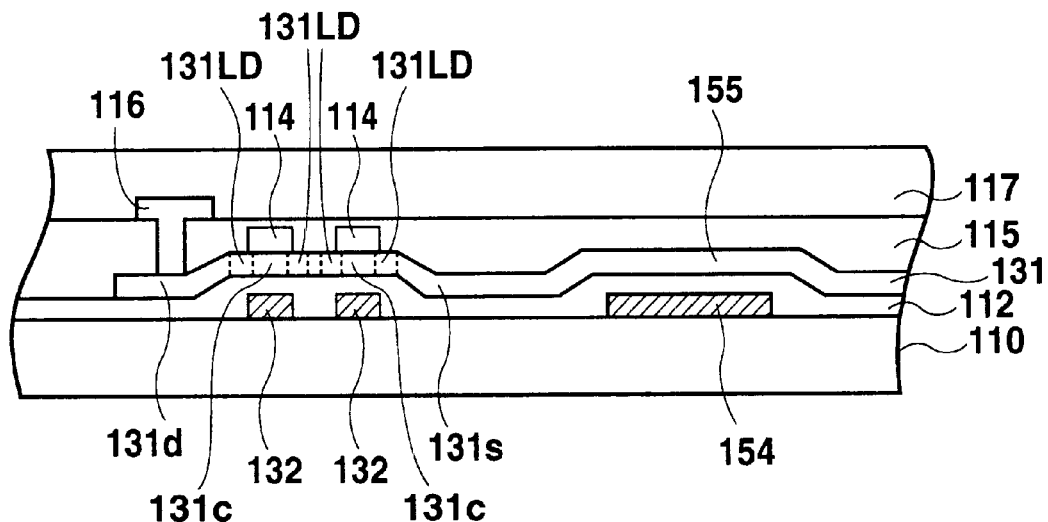
FIGS. 3A and 3B are cross sections of the EL display device taken along lines A—A and B—B in FIG. 1, respectively.
Figure 3B:
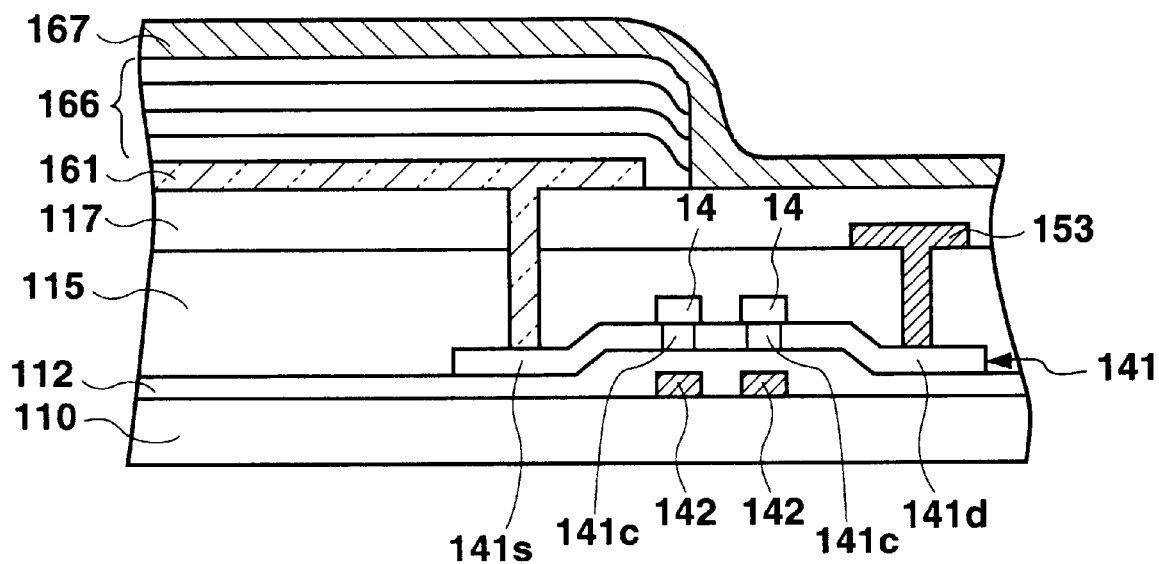
Figure 4:
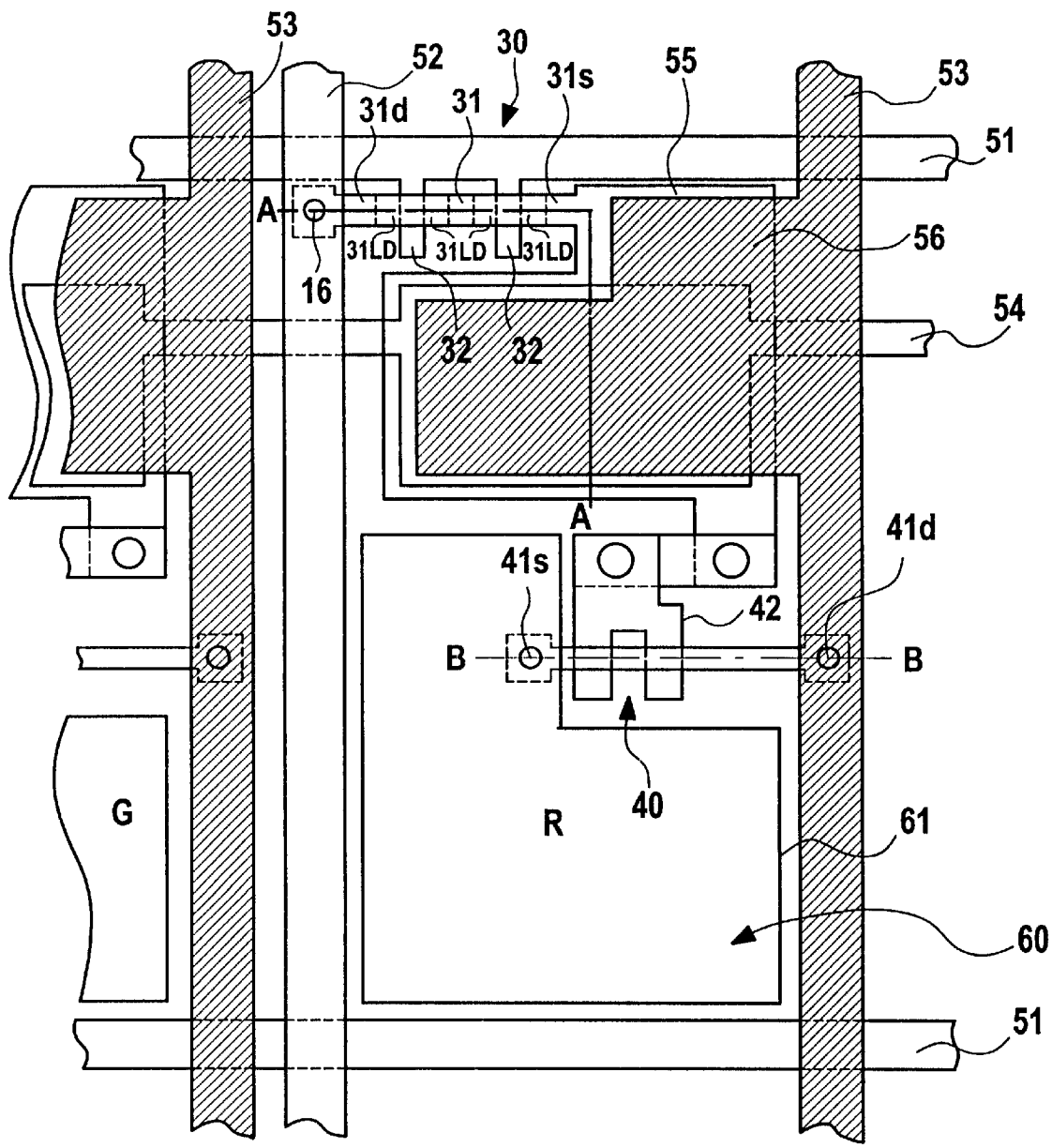
FIG. 4 is a plan view of an EL display device according to the present invention.
Figure 5A:
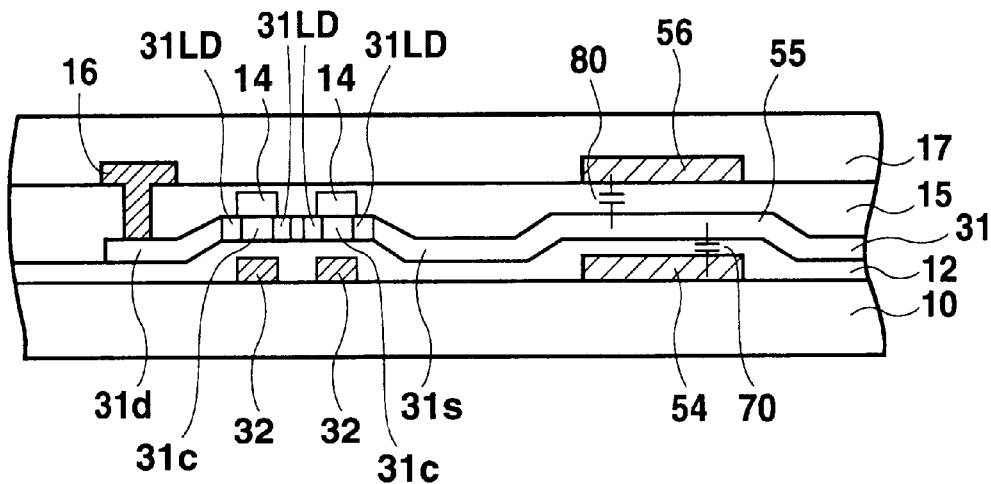
FIGS. 5A and 5B are cross sections of the EL display device taken along lines A—A and B—B in FIG. 4, respectively.
Figure 5B:
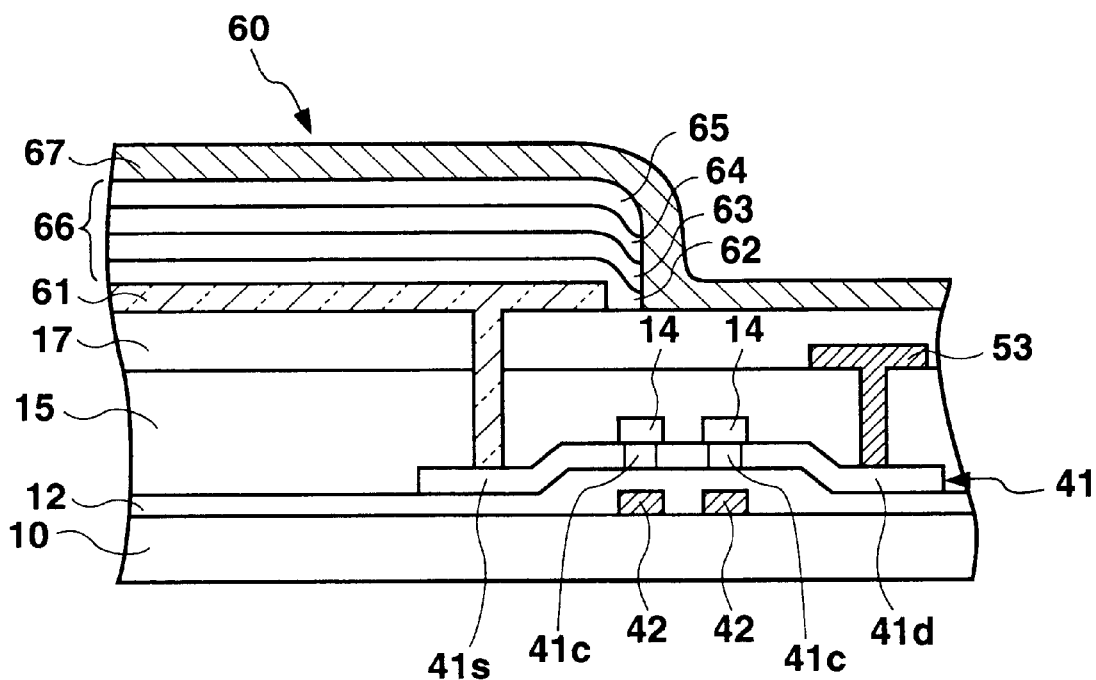
Figure 6:
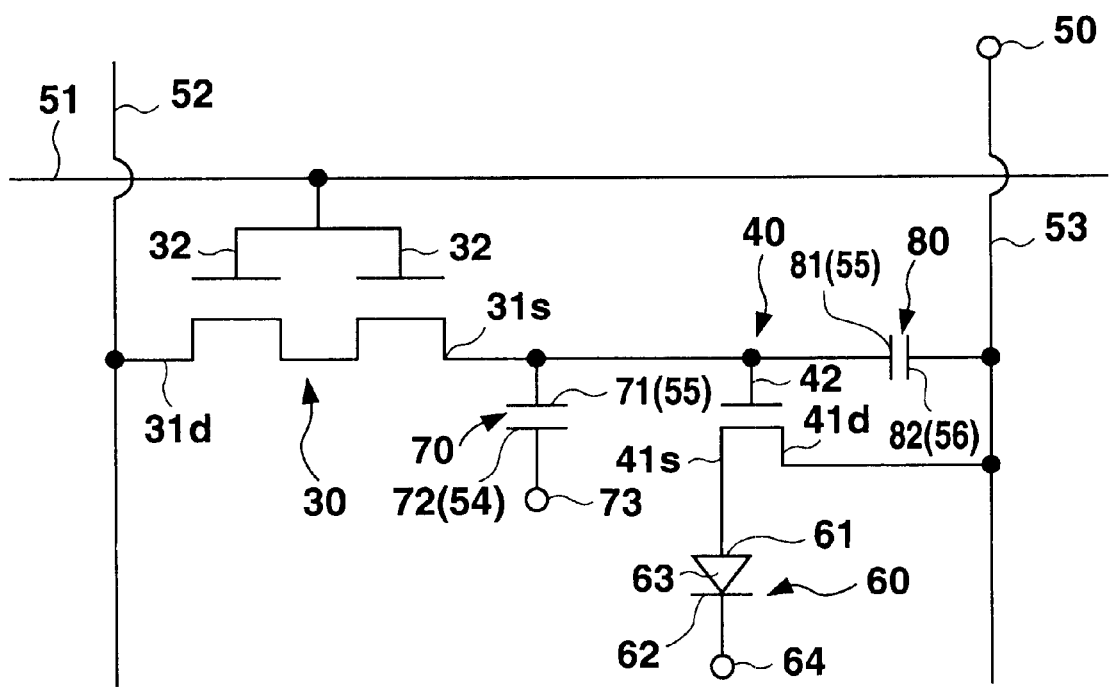
FIG. 6 is an equivalent circuit diagram of an EL display device according to the present invention.

FIG. 4 shows, in a plan view, one display pixel when the present invention is applied to an organic EL display device, and FIGS. 5A and 5B are cross sections taken along lines A—A and B—B in FIG. 4, respectively. FIG. 6 shows an equivalent circuit diagram of the organic EL display device.

According to this embodiment, first and second TFTs 30 and 40 are so-called bottom gate type TFTs in which a gate electrode is disposed under an active layer 31 or 41, and in each TFT a p-Si film is used as the active layer and gate electrodes 32, 42 have a double gate structure.

Referring to FIGS. 4, 5A and 5B, a display pixel is formed in a region enclosed by a gate signal line 51 and a drain signal line 52. Around the intersection of both signal lines is formed the first TFT 30 whose source (a second electrode region) 31s also functions as a storage capacitor electrode 55 constituting a capacitor 70 between the source 31s and a storage capacitor electrode 54 and is connected to the gates 42 of the second TFT 40. A source (a second electrode region) 41s of the second TFT 40 is connected to an anode 61 of an organic EL element 60 while a drain 41d is connected to a power supply line 53 for driving the organic EL element 60.

The first storage capacitor electrode line 54 is disposed in parallel to the gate signal line 51 in the vicinity of the first TFT. The storage capacitor electrode 54 comprising chromium or the like is arranged so as to oppose, via a gate insulating film 12, the second storage capacitor electrode 55 of a p-Si film connected to the source 31s of the first TFT 30, thereby forming between these capacitor electrodes a first storage capacitor 70 for accumulating charges.

Further, a third storage capacitor electrode 56 is disposed in a corresponding pixel region so as to be opposed via an interlayer insulating film 15 to the second storage capacitor electrode 55 of a p-Si film which is connected to the source 31s of the first TFT 30, thereby forming between these capacitor electrodes a second storage capacitor 80 for accumulating charges.

The first and second storage capacitors 70 and 80 thus formed function such that they together hold a voltage applied to the gate electrodes 42 of the second TFT 40.

Referring to FIG. 6, one electrode 71, 81 of the first and second storage capacitors 70 and 80, namely the second storage capacitor electrode 55 in FIGS. 4 and 5A, is connected to the source 31s of the first TFT 30. The other electrode 72 of the first storage capacitor 70, namely the first storage capacitor electrode 54, is connected to first storage capacitor electrodes 54 provided in adjacent display pixels to be thereby connected to a common electrode 73 to which a constant potential is applied. On the other hand, the other electrode 82 of the second storage capacitor 80, namely the third storage capacitor electrode 56, is connected to the power supply line 53 connected to the power supply 50 of the organic EL element 60.

A plurality of display pixels each comprising the organic EL element 60 and TFTs 30 and 40 are arranged in a matrix on the substrate 10, thus forming an organic EL display device.

As shown in FIGS. 5A and 5B, the organic EL display device comprises the TFTs and the organic EL element sequentially formed on a substrate 10 comprising glass, synthetic resin, or the like, or a substrate 10 obtained by forming an insulating film such as a $SiO_2$ film, a SiN film, or the like on a conductive substrate or a semiconductor substrate or the like.

Referring back to FIGS. 4 and 5A, the first TFT 30, which is a switching TFT, comprises, on an insulating substrate 10 comprising a quartz glass, non-alkali glass, or the like, the gate signal line 51 including the gate electrodes 32 and comprising a metal with a high melting point such as Cr, Mo, or the like, the drain signal line 52 comprising Al and including the drain electrode 16, and the power supply line 53 functioning as the power supply of the organic EL element and comprising Al. The first storage capacitor electrode 54 comprising a refractory metal with a high melting point such as Cr, Mo, or the like, is further provided in the same layer as the gate electrodes.

Subsequent to formation of the gate signal line 51 (the gate electrodes 32) and the first storage capacitor electrode 54 on the substrate 10, a gate insulating film 12, and an active layer 31 comprising a p-Si film are sequentially formed. On the active layer 31 at the positions above the respective gate electrodes 32, stopper insulating films 14 comprising $SiO_2$ are provided so as to function as masks covering channels 31c for preventing ions from entering when ions are doped therein for forming the source 31s and the drain 31d. The active layer 31 of the first TFT 30 has a so-called LDD structure. Specifically, low concentration regions 31LD are provided at each side of a pair of the channels 31c facing the respective gates 32, and a source 31s and a drain 31d which are high concentration regions are further provided to the outsides of the low concentration regions. The p-Si film constituting the active layer extends to the region above the first storage capacitor electrode 54 so as to function as the second storage capacitor electrode 55, thereby forming the first storage capacitor 70 with the first storage capacitor electrode 54 via the gate insulating film 12 as already described.

Further, over the entire surface covering the gate insulating film 12, the active layer 31, and the stopper insulating films 14, an interlayer insulating film 15 is formed by sequentially accumulating a $SiO_2$ film, a SiN film and a $SiO_2$ film, and a metal such as Al or the like is used to fill a contact hole formed in the position in the interlayer insulating film 15 corresponding to the drain 31d to thereby form a drain electrode 16. Then, a planarization insulating layer 17 comprising an organic resin is further provided over the entire surface for surface planarization.

Next, the second TFT 40, which is an organic EL element driving TFT, will be described.

Referring to FIG. 5B, on the insulating substrate 10 comprising a quartz glass, non-alkali glass, or the like, the gate electrodes 42 each comprising a refractory metal (metal having a high melting point) such as Cr, Mo, or the like are formed, and a gate insulating film 12 and an active layer 41 comprising a p-Si film are sequentially formed.

In the active layer 41, channels 41c which are intrinsic or substantially intrinsic are formed at the positions above the respective gate electrodes 42. Regions at each side of the channel pair are covered with resists and subjected to ion doping with p-type impurities, for example boron(B), to thereby form a source 41s and a drain 41d, respectively.

The interlayer insulating film 15 is formed by sequentially accumulating a $SiO_2$ film, a SiN film and a $SiO_2$ film over the entire surface of the gate insulating film 12 and the active layer 41, and a contact hole in the interlayer insulating film 15 which is formed so as to correspond to the drain 41d (a first electrode region) is filled with a metal such as Al to form the power supply line 53 connected to the power supply 50. Further, the planarization insulating film 17 comprising an organic resin to planarize the surface is provided over the entire surface. On the planarization insulating film 17 is provided a transparent electrode, in this example the anode 61 of the organic EL element, which comprises ITO and makes contact with the source 41s via a contact hole formed at the position in the planarization insulating film 17 and in the interlayer insulating film 15 corresponding to the source 41s.

The organic EL element 60 is constituted such that the emissive element layer 66 is formed between the anode 61 and the cathode 67, and in this embodiment, the anode 61, the emissive element layer 66, and the cathode 67 are sequentially formed on the planarization insulating film 17, as shown in FIG. 5B. Further, according to this embodiment, the emissive element layer 66 which comprises an organic compound, is constituted such that a first hole-transport layer 62, a second hole-transport layer 63, an emissive layer 64 and an electron-transport layer 65 are formed in that order.

The anode 61 comprises a transparent electrode of ITO as already described. The first hole-transport layer 62 comprises MTDATA (4,4',4"-tris (3methylphenylphenylamino) triphenylamine), the second hole-transport layer 63 comprises TPD (N,N'-diphenyl-N,N'-di(3methylphenyl)-1,1'-biphenyl-4,4'-diamine), the emissive layer 64 comprises quinacridone derivative and $Bebq_2$ (bis(10-hydroxybenzo [h] quinolinato berylliuim), the electron-transport layer 65 comprises $Bebq_2$, and the cathode 67 comprises magnesium-indium alloy. The cathode 67 is formed as a common electrode to cover the entire region or at least the display region of the substrate 10 on which the organic EL display device is formed. It is to be understood that structures and materials other than those described above may be used for the organic EL element 60.

The organic EL element 60 thus configured receives current supplied from the power supply 50 by operation of the first TFT 30, the first and second storage capacitors 70 and 80, and the second TFT 40, so that holes injected from the anode 61 and electrons injected from the cathode 67 are recombined inside the emissive layer 64 to excite organic molecules therein, thereby causing exciton. In the process of radiation and deactivation by the exciton, the emissive layer 64 produces light which is emitted from the transparent anode 61 through the transparent insulating substrate 10.

As described above, according to this embodiment, the first and second storage capacitors 70 and 80 are provided between the source 31s of the first TFT 30 and the gates of the second TFT 40, which are elements for constituting one pixel. The first storage capacitor 70 is formed by the first storage capacitor electrode 54 and the second storage capacitor electrode 55 which are opposed to each other via the gate insulating film 12, while the second storage capacitor 80 is formed by the electrode 55, which is one electrode of said first storage capacitor 70, and the third storage capacitor electrode 56 which oppose each other via the planarization insulating film 17. As shown in FIG. 4, the third storage capacitor electrode 56 is disposed so as to superimpose the second storage capacitor electrode 55 in the region where the first and second capacitor electrodes 54 and 55 face each other. Therefore, formation of the second storage capacitor 80 in addition to the first storage capacitor 70 will not cause reduction in the aperture ratio, and the storing capacity in one pixel can be increased without reducing the aperture ratio of the display device. Namely, the storing capacity in one pixel can be increased without enlarging the area of the storage capacitor electrode in the plane direction, and therefore a voltage to be applied to the gate electrodes 42 of the second TFT 40 in accordance with display contents can be held for a sufficient period before being applied to the gate electrodes 42. Thus, sufficient current can be applied from the power supply 50 via the power supply line 53 and the second TFT 40 to the organic EL element 60, which then emits light with luminance according to the supplied current, and only when a current is applied, thereby achieving a bright and accurate display.

Further, as is apparent from FIG. 4, the third storage capacitor electrode 56 is integrally formed with the power supply line 53. This eliminates a need for extra processes for forming the third storage capacitor electrode 56, namely the second storage capacitor 80, and therefore its inclusion causes no cost increase.

It is to be understood that according to the present invention, both in an n-type TFT (the first TFT 30) and a p-type TFT (the second TFT 40), the drain is an electrode from which a current flows into the TFT whereas the source is an electrode from which a current flows out.

Although the above description of the preferred embodiment described an example wherein the gate electrodes 32, 42 have a double-gate structure, the present invention is not limited to such a configuration and can achieve the same effects if a single-gate structure or a multi-gate structure comprising three or more gates is adopted.

Further, although in the above example the second TFT is a p-type channel TFT, the second TFT may be an n-type channel TFT.

Although a p-Si film is used as an active layer in the above example, a microcrystal silicon film or an amorphous silicon film may also be used.

Of the elements constituting each pixel, including the gate electrodes, the gate insulating layer, the active layer or the like of the first and second TFTs 30 and 40, the interlayer insulating film 15, the planarization insulating film 17, or the like, common elements are preferably formed in the same manufacturing process in view of reduction of variance in the characteristics of the TFTs or the like. The active layers for respective TFTs can be formed in the same process when a p-Si film is used as in the above example. For example, a polysilicon layer obtained by applying policrystalization process such as laser annealing to an amorphous silicon film formed on the entire surface of a substrate, may be used as the active layer of the first and the second TFTs 30 and 40.

Further, although the description of the above embodiment featured an organic EL display device, the present invention is not limited thereto and can provide similar effects when applied to an inorganic EL display device having an inorganic EL element using an emissive layer comprising an inorganic material in place of the organic EL element, a vacuum fluorescent display (VFD) comprising as an emissive layer a fluorescent layer between two electrodes, or the like.

While the preferred embodiment of the present invention has been described using specific terms, such description is for illustrative purposes only, and it is to be understood that changes and variations may be made without departing from the spirit or scope of the appended claims.

What is claimed is:

1. An electroluminescence display device comprising:
   an electroluminescence element disposed on a substrate and having first and second electrodes and an emissive layer disposed between the first and second electrodes;
   a first thin film transistor in which a gate electrode is connected to a gate line and a first electrode is connected to a data line;
   a second thin film transistor in which a gate electrode is connected to a second electrode of said first thin film transistor, a first electrode is connected to a power supply to said electroluminescence element, and a second electrode is connected to the electroluminescence element; and
   first and second storage capacitors, one storage capacitor electrode of each of which is connected to the second electrode of said first thin film transistor and to the gate electrode of said second thin film transistor.

2. The electroluminescence display device of claim 1, wherein
   said first storage capacitor is formed by arranging a first storage capacitor electrode and a second storage capacitor electrode which is connected to the second electrode of the first thin film transistor and to the gate electrode of the second thin film transistor such that they are opposed to each other via an insulating layer, and
   said second storage capacitor is formed by arranging said second storage capacitor electrode and a third storage capacitor electrode such that they are opposed to each other via an insulating layer.

3. The electroluminescence display device of claim 1, wherein, said first and second storage capacitors share one electrode connected to both the second electrode of said first thin film transistor and the gate electrode of the second thin film transistor.

4. The electroluminescence display device of claim 1, wherein,
   said first storage capacitor is formed by arranging the first storage capacitor electrode and the second storage capacitor electrode connected to the second electrode of the first thin film transistor and to the gate electrode of the second thin film transistor such that they are opposed to each other via an insulating layer, and
   said second storage capacitor is disposed so as to superpose said first storage capacitor and is formed by arranging said second storage capacitor electrode and the third storage capacitor electrode such that they are opposed to each other via an insulating layer.

5. The electroluminescence display device of claim 1, wherein
   the second storage capacitor electrode of said second storage capacitor is integrally formed with a power supply line for supplying a power from said power supply to the first electrode of the second thin film transistor.

6. An electroluminescence display device comprising:
   an electroluminescence element having an anode, a cathode, and an emissive layer interposed between the anode and the cathode;
   a first thin film transistor in which a gate electrode is connected to a gate line and a first electrode is connected to a data line;
   a second thin film transistor in which a gate electrode is connected to a second electrode of said first thin film transistor, a first electrode is connected to a power supply for said electroluminescence element, and a second electrode is connected to the electroluminescence element;
   a first storage capacitor including a first storage capacitor electrode and a second storage capacitor electrode which is connected to the second electrode of said first thin film transistor and to the gate electrode of said second thin film transistor; and
   a second storage capacitor including said second storage capacitor electrode and a third storage capacitor electrode connected to a power supply line for supplying a power from said power supply to said electroluminescence element.

7. The electroluminescence display device of claim 6, wherein
   the third storage capacitor electrode is integrally formed with the power supply line for supplying a power from said power supply to the first electrode of the second thin film transistor.

8. The electroluminescence display device of claim 6, wherein
   a predetermined direct current voltage is applied to the first storage capacitor electrode.

9. A light emissive display device comprising:
   an emissive element disposed on a substrate and having first and second electrodes and an emissive layer provided between the first and second electrodes;
   a first thin film transistor in which a gate electrode is connected to a gate line and a first electrode is connected to a data line;
   a second thin film transistor in which a gate electrode is connected to a second electrode of said first thin film transistor, a first electrode is connected to a power supply for said emissive element, and a second electrode is connected to the emissive element; and
   first and second storage capacitors each having one storage capacitor electrode connected to the second electrode of said first thin film transistor and to the gate electrode of said second thin film transistor.

10. The light emissive display device of claim 9, wherein
    said first storage capacitor is formed by arranging a first storage capacitor electrode and a second storage capacitor electrode which is connected to the second electrode of the first thin film transistor and to the gate electrode of the second thin film transistor such that they are opposed to each other via an insulating layer, and
    said second storage capacitor is formed by arranging said second storage capacitor electrode and a third storage capacitor electrode such that they are opposed to each other via an insulating layer.

11. The light emissive display device of claim 9, wherein, said first and second storage capacitors share one electrode connected to both the second electrode of said first thin film transistor and to the gate electrode of the second thin film transistor.

12. The light emissive display device of claim 9, wherein,
said first storage capacitor is formed by arranging the first storage capacitor electrode and the second storage capacitor electrode connected to the second electrode of the first thin film transistor and to the gate electrode of the second thin film transistor such that they are opposed to each other via an insulating layer, and
said second storage capacitor is disposed so as to superpose said first storage capacitor and is formed by arranging said second storage capacitor electrode and the third storage capacitor electrode such that they are opposed to each other via an insulating layer.

13. The light emissive display device of claim 9, wherein
the second storage capacitor electrode of said second storage capacitor is integrally formed with the power supply line for supplying a power from said power supply to the first electrode of the second thin film transistor.

14. The light emissive display device of claim 9, wherein said emissive layer comprises an organic compound as an emissive material.

* * * * *